March 15, 1966 D. C. JOHNSTON 3,240,602

CONTROL APPARATUS AND PHOTOMECHANICAL PROCESSES FOR PRODUCING SUCH

Filed July 18, 1961

INVENTOR.
DONALD C. JOHNSTON

BY

[signature]

ATTORNEY

United States Patent Office 3,240,602
Patented Mar. 15, 1966

3,240,602

CONTROL APPARATUS AND PHOTOMECHANICAL PROCESSES FOR PRODUCING SUCH

Donald C. Johnston, Richfield, Minn., assignor to Honeywell Inc., a corporation of Delaware Filed July 18, 1961, Ser. No. 124,828
9 Claims. (Cl. 96—36)

This invention pertains generally to printed circuit boards and more specifically to an improved process for obtaining printed circuit components with a minimum of depositions.

There are several embodiments of this invention. The one to be used depends upon the accuracy tolerance of the components which are required by the user in his particular needs. In a first embodiment selective etching is performed on a conductively plated printed circuit board and this etched board is then subjected to selective deposition of a resistive material and a conductive material. It must be realized that the above embodiment does not necessarily need to use vacuum deposition or selective etching of a conductive plating on the printed circuit substrate. As is known in the prior art, a great deal of time is used in bringing a vacuum deposition system up to or down from the pressure required. Therefore, each deposition eliminated produces corresponding time savings. The coating could be a non-conductive material which can be treated to form a type of mask. The board is then selectively etched again to obtain, in one deposition and two etching processes, a finished printed circuit board with resistive and conductive paths. Also, instead of two etchings, the resistive and capacitive material could be selectively deposited on the resistor and conductor paths through a type of mask means and then etched only once to remove the conductive material from the resistance path.

A second embodiment uses an isolating third conductive layer between the resistive material and the top conducting material to prevent interaction between the second conducting material and the resistive material and thereby obtains greater accuracy from resistance variance as a result of etching.

A third embodiment gives the greatest accuracy or "tightest" tolerance values for the components of the printed circuit board using this process. Two depositions are required. First a resistive material is deposited on the printed circuit board. The resistive material is then selectively etched to leave only resistive paths on the printed circuit board. Then the board is subjected to the deposition of an isolating layer and a conductive layer. Another selective etching is required to produce the finished printed circuit product with conductive paths and resistive paths.

One object of this invention is to provide a more accurate method of obtaining resistance elements on a printed circuit board.

Another object of this invention is to provide a means for obtaining a finished printed circuit product with a minimum of depositions and to thus obtain or produce finished printed circuit products in a shorter time.

Other objects will be ascertained by referring to the following figures and specification in which.

Figure 1:
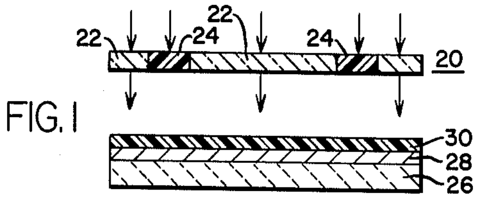
FIGURE 1 illustrates the process of exposing the photoconductive material perparatory to the first selective etching.

In FIGURE 1 a suitable mask 20, such as a photographic film negative, is shown with transparent areas generally designated as 22 and opaque areas generally designated as 24. Thus, light, which is illustrated as arrows, will pass through the areas designated as 22 but will be prevented from passing through the areas designated as 24. The areas 24 define all of the areas on the desired printed circuit product which constitute either resistive or conductive paths. In the lower part of FIGURE 1, a substrate 26 of glass, epoxy resin, ceramic, or any other suitable material which has a mask material 28 attached thereto is shown. The material 28, in one embodiment of this invention, is beryllium copper. The substrate material 26 can be purchased with the beryllium copper already attached or the entire quantity of substrates can be exposed to deposition and the material 28 can be deposited all in one process and is not considered to be part of the one or two deposition processes for making the printed circuit products herein disclosed. A layer of KPR (Kodak Photo Resist, Eastman Kodak Company) or other suitable photosensitive resist material 30 is shown as a layer on top of the material 28. If one desires more information concerning KPR, reference may be made to one or more of the following patents: 2,610,120; 2,666,701; 2,670,285-6-7; 2,690,966; 2,691,-584; 2,697,039; 2,725,372; 2,732,297; and 2,732,301. Also, as is known gy those skilled in the art, other photoresists such as egg albumen may be used for achieving the desired results. It must be realized that the deposited layers are extremely thin and have been very much exaggerated for clarity. The KPR or photosensitive resist 30 must be applied in a dark room and kept in a dark place until exposed to light through the mask 20. After the material 30 is exposed it must be developed. One suitable developer is trichloroethylene. The unexposed KPR 30 is washed away in the developing process.

Figure 2:
FIGURE 2 shows the printed circuit with the unexposed portions of the photosensitive material washed away.

After developing the resist 30, the printed circuit appears as is shown in FIGURE 2. The product shown in FIGURE 2 is exposed to an etching material or solution which, if the material 28 is beryllium copper, can be a solution containing the following components:

| | | |
|---|---|---|
| $H_2O$ | ml | 100 |
| NaCl (saturated solution) | ml | 4 |

| | | |
|---|---|---|
| $K_2Cr_2O_7$ | gr | 2 |
| $H_2SO_4$ (specific gravity 1.84) | ml | 8 |

If other materials are used for the layer 28, other etching solutions may be used and it is not intended to imply that this is the only etching solution useable with beryllium copper. When the substrate is placed in the solution only the portions of the material 28 which are not protected by the exposed resist 30 are etched away to give the product shown in FIGURE 3.

Figure 4:
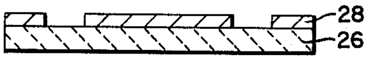
FIGURE 4 shows the underlying material after the photosensitive material is washed off and after the underlying material has been etched to form a mask.
Figure 5:
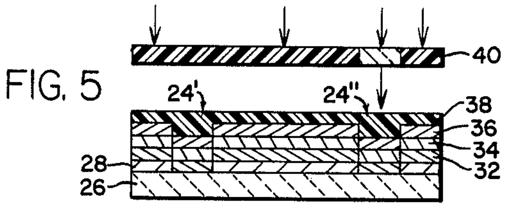
FIGURE 5 illustrates the process of exposing the conductive paths after the substrate has been subjected to three depositions and a coating of photosensitive material has been applied.

After the material 28 is etched, it forms a pattern which is attached to substrate 26. FIGURE 4 shows the substrate with the pattern 28 after the exposed resist 30 is removed with a suitable solvent such as acetone. As mentioned before, this is only one way of obtaining the masking element 28. It could be composed of exposed KPR in some applications. Also, the mask 28 may be just a material such as steel which is held in place by clamps or the like over the substrate 26 to allow deposition therethrough and later the mask may be removed along with the deposited materials thereon, no etching being required for removing mask 28. The product shown in FIGURE 4 can be treated in any of several ways to produce different tolerance limits in the resistance values of the finished product. One method is to deposit upon the material shown in FIGURE 4 a layer 32 as shown in FIGURE 5 of nickel chromium alloy or any other suitable resistance material. A layer of aluminum or other isolating material 34 is then deposited directly upon the Nichrome 32. A layer of copper or other suitable conducting material 36 is then deposited directly upon the aluminum 34. Another layer of photosensitive resist or KPR 38 is then applied on top of the copper 36. Again it must be realized that these layers are extremely thin and the actual result is much different proportionately than is shown in this figure since relatively thick layers of material are necessary to show the process here. It may be assumed that in the finished product path 24′ is to be a resistance path and path 24″ is to be a conductive or conductor path. A mask 40, which may be composed of a photographic film or any other suitable material, allows light to expose the portions to be used as conductive paths 24″.

Figure 6:
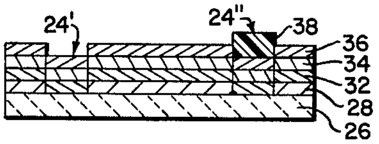
FIGURE 6 shows the printed circuit after the unexposed photosensitive material is washed away.

The KPR layer on the product shown in FIGURE 5 is then developed with a solution such as the trichloroethylene aforementioned to produce the product shown in FIGURE 6. It will be noted that path 24″ has a protective coating of photoresist over the aluminum 34 and the copper 36. The path 24′, however, along with the rest of the surface does not have a layer of photoresist 38 protecting the material underneath.

Figure 3:
FIGURE 3 illustrates the portions of underlying material etched away which are not protected by the exposed photosensitive material.

The substrate shown in FIGURE 6 is exposed to an etching solution containing the same components as described in the first etching process used in FIGURE 3. The substrate is also etched in a sodium hydroxide solution to remove the aluminum layer. If another type isolating layer were used, the sodium hydroxide might not need to be used. The conductor path 24″ is shown with the nickel chromium alloy, aluminum, and copper protected by the photoresist 38 so that this material was not etched by the etching fluid. The etching solution used does not attack nickel chromium alloy so the path 24′ of nickel chromium alloy 32 remains. If other resistive materials are used, other etching may have to be used to practice this invention.

Figure 7:
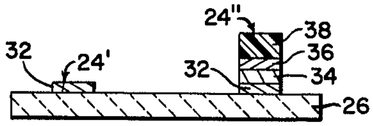
FIGURE 7 shows the printed circuit board after the etching process is completed and before the photosensitive material, which is exposed, is removed.
Figure 8:
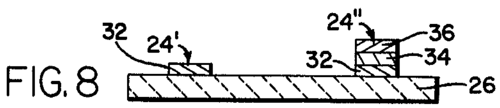
FIGURE 8 shows the finished printed circuit product with resistive and conductive layers or paths.

In FIGURE 8 the finished product is shown after the exposed photoresist 38 in FIGURE 7 is removed with the use of acetone.

It is of considerable importance to obtain a process which requires only one deposition of materials since it takes several hours for the container in which the deposition takes place to warm up and cool off before and after the deposition takes place. The rest of the process steps shown in FIGURES 1 through 8 require very little time comparatively. It is therefore very advantageous to use a process which requires a minimum number of depositions.

If the high quality resistors obtained in the process shown in FIGURES 1 through 8 are not required, a slightly wider tolerance resistor will be obtained if the deposition of the aluminum is left out of the steps going from FIGURE 4 to FIGURE 5. When the aluminum is left out of the process, some copper interacts with the nickel chromium alloy 32 in the deposition process so that the etching material sometimes takes more of the nickel chromium alloy 32 than is removed in other etching periods. Normally the etching solution described does not attack the nickel chromium alloy, but where the copper 36 is deposited directly upon the nickel chromium alloy 32 the etching solution tries to attack the copper 36 and in doing so removes particles of the nickel chromium alloy 32. It is difficult to solder to the aluminum isolating material 34 used in one embodiment of the invention, therefore the copper conductive coating 36 is used for its characteristic of "easy" solderability.

When the etching fluid is applied to the product shown in FIGURE 6, the etching material, while not attacking the nickel chromium alloy 32, diffuses through the nickel chromium alloy to remove the underlying beryllium copper 28 and thereby leaves portions of the nickel chromium alloy unsupported on either side of the paths 24′ and 24″. This unsupported nickel chromium alloy immediately washes away upon the application of a moving fluid. The unsupported nickel chromium alloy may also be brushed off if brushed very lightly with a cotton swab.

FIGURES 9 through 12 may be used as a substitute for the process steps illustrated in FIGURES 5 and 6 if resistors of a higher quality and tighter tolerance are desired than what is obtained in the first described process.

Figure 9:
FIGURE 9 shows a first step in a more accurate process to replace the steps shown in FIGURES 5 and 6 in which a resistive material is deposited on top of an underlying material being used as a mask and the open portions of the substrate.

In FIGURE 9 a layer of nickel chromium alloy 32 is shown deposited on the substrate and beryllium copper base shown in FIGURE 4.

The product shown in FIGURE 9 is then exposed to the etching fluid described in connection with FIGURE 3 to remove the beryllium copper and thus remove the unsupported nickel chromium alloy 32 to produce the product shown in FIGURE 10. Again two nickel chromium alloy paths are obtained, first 24′ which is to be the resistive path, and second 24″ which is to be the conductive path.

Figure 10:
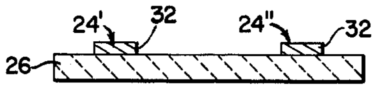
FIGURE 10 illustrates the printed circuit after the underlying mask material is etched away.
Figure 11:
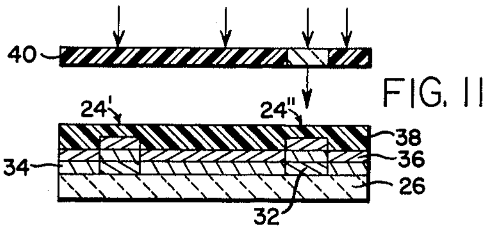
FIGURE 11 shows the process of exposing the photosensitive material after the product shown in FIGURE 10 is subjected to two depositions and a coating of photosensitive material.

In FIGURE 11 a product is shown which is substantially the same as that in FIGURE 10 with a layer of aluminum 34 deposited upon one surface. A layer of copper 36 is deposited upon the layer of aluminum 34. A layer of photoresist 38 is applied on top of the copper 36 and a mask 40 identical to the mask 40 shown in FIGURE 5 is used to restrict the light, applied to the photoresist 38, to the path 24″.

Figure 12:
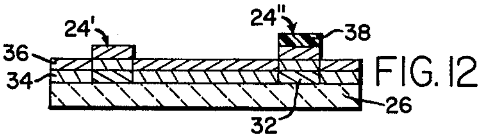
FIGURE 12 shows the printed circuit after being exposed to light in the conductive path areas and after the unexposed photosensitive material is washed away.

The product shown in FIGURE 11 is then developed with trichloroethylene to produce the product shown in FIGURE 12 where the exposed photoresist is shown in path 24″. The unexposed portions of the photoresist have been removed to leave the copper exposed in areas other than 24″. The product shown in FIGURE 12 is then exposed to the etching compound described for use with FIGURE 6 to produce the article shown in FIGURE 7. A product identical to what is shown in FIGURE 7 is thereby produced and subjected to the same treatment to produce the finished product shown in FIGURE 8.

The steps in FIGURES 9 through 12 require two depositions and are therefore used only when very high quality and "tight" tolerance resistors are required. This process shown in FIGURES 9 through 12 requires shorter etching time of the finished product and therefore less underetching results from the etching solution attacking the sides of the conductor path 24″. If the range of resistance values is quite significant in that very small resistance values and very large resistance values are used, a slight underetching on the ends of the resistive strips can cause considerable change in tolerance even though the large resistance value resistors are very well within tolerance.

If the resistance value of the resistor obtained with this process is too small, the resistance can be increased easily by removing the top conductive layer or layers with chemical or mechanical processes to expose more resistance material and thereby increase the resistor resistance value.

It is to be understood that other materials can be used rather than the aluminum, copper, nickel chromium alloy, and beryllium copper described in this specification. The invention lies in the order and way that the materials are deposited and etched so that only one or two depositions are required to produce the finished product.

While the principles of the invention have been described above in connection with specific embodiments, it is to be clearly understood that this description is made only by way of example and not as a limitation on the scope of the invention. It is intended that all modifications hereto foreseeable to those skilled in the art be included and that this invention be restricted only by the following claims.

I claim:

1. The method of producing a printed circuit which comprises the following steps: depositing a film of beryllium copper on a substrate; applying a first photosensitive film to fully cover said beryllium copper film; applying light to said first photosensitive film to expose all areas other than that to be used for the combined areas of the conductive paths and the resistive paths by the use of a positive photographic film mask; removing said unexposed portions of said first photosensitive film; etching all unprotected areas of said beryllium copper not covered by said exposed photosensitive film to completely remove said unprotected areas; removing said exposed photosensitive film; depositing a film of nickel chromium alloy on said remaining substrate and beryllium copper; underetching said nickel chromium alloy supported by said beryllium copper to leave only said nickel chromium alloy deposited directly upon said substrate and to remove said nickel chromium alloy previously supported by said beryllium copper; depositing a film of aluminum upon said substrate and said nickel chromium alloy; depositing a film of copper upon said film of aluminum, said aluminum preventing interaction and thus change of resistance between said copper and said nickel chromium alloy; coating said film of copper with a second film of photosensitive material; applying light to expose said areas to be used as conductive paths through the use of a negative film mask; removing said unexposed portions of said second photosensitive film; etching said unprotected copper and aluminum to leave nickel chromium alloy paths in areas to be used as resistance means and to leave paths composed of nickel chromium alloy, aluminum, copper, and exposed photosensitive material in areas to be used as conductive paths; and removing said remaining exposed photosensitive material to form a finished printed circuit means.

2. The method of producing a printed circuit which comprises the following steps: depositing a first film of copper on a substrate; applying a first photosensitive film to fully cover said first copper film; applying light to said first photosensitive film in all areas other than that to be used for conductive paths or resistive paths; removing said unexposed portions of said first photosensitive film; etching all areas of said first copper film which are exposed to an etching means; depositing a film of nickel chromium alloy on said remaining substrate and said first copper film; under-etching said nickel chromium alloy supported by said first copper film, with an etching means which does not etch nickel chromium alloy and does etch copper, to leave only said nickel chromium alloy deposited directly upon said substrate and to remove said nickel chromium alloy previously supported by said first copper film; depositing a film of aluminum upon said substrate and said nickel chromium alloy; depositing a second film of copper upon said film of aluminum, said aluminum preventing interaction between said copper and said nickel chromium alloy; coating said second film of copper with a second film of photosensitive material; applying light to expose said areas to be used as conductive paths; removing said unexposed portions of said second photosensitive film; etching said unprotected copper and aluminum with an etching means which does not etch nickel chromium alloy to leave nickel chromium alloy paths in areas to be used as resistance means and to leave paths composed of nickel chromium alloy, aluminum, copper, and exposed photosensitive material to be used as conductive paths; and removing said remaining exposed photosensitive material to form a finished printed circuit means.

3. The method of producing a printed circuit which comprises the following steps: applying a dissolvable mask to a substrate, said mask having open areas where conductive and resistive paths are to be on a finished product; depositing a film of nickel chromium alloy on said remaining substrate and said mask; underetching said nickel chromium alloy supported by said dissolvable mask with an etching means which does not etch nickel chrmium alloy to leave only said nickel chromium alloy deposited directly upon said substrate and to remove said nickel chromium alloy previously supported by said dissolvable mask; depositing a film of aluminum upon said substrate and said nickel chromium alloy; depositing a film of copper upon said film of aluminum, said aluminum minimizing change of resistance of said nickel chromium alloy due to interaction with said copper; coating said film of copper with a film of photosensitive material; applying light to expose said areas to be used as conductive paths; removing said unexposed portions of said photosensitive film; etching said unprotected copper and aluminum with an etching means which does not etch nickel chromium alloy to leave nickel chromium alloy paths in areas to be used as resistance means and to leave paths composed of nickel chromium alloy, aluminum, copper, and exposed photosensitive material to be used as conductive paths; and removing said remaining exposed photosensitive material to form a finished printed circuit means.

4. The method of producing a printed circuit which comprises the following steps: applying a dissolvable mask to a substrate, said mask having open areas where conductive and resistive paths are to be on a finished product; applying a film of resistance means on said remaining substrate and said mask; underetching said resistance means supported by said dissolvable mask with an etching means which does not remove said resistance means to leave only said resistance means applied directly upon said substrate and to remove said resistance means previously supported by said dissolvable mask; depositing a film of isolating conductive material upon said substrate and said resistance means; depositing a film of easily solderable conductive material upon said film of isolating conductive material, said isolating material preventing interaction between said resistance means and said solderable material; coating said film of solderable material with a film of photosensitive material; applying light to expose said areas to be used as conductive paths; removing said unexposed portions of said photosensitive film; etching said unprotected conductive materials with an etching means which does not etch said resistance means to leave resistance paths in appropriate areas and to leave paths composed of conductive materials, resistance means, and exposed photosensitive material to be used as conductive paths; and removing said remaining exposed photosensitive material to form a finished printed circuit means.

5. The method of producing a printed circuit which comprises the following steps: depositing a film of beryllium copper on a substrate; applying a first photosensitive film to fully cover said beryllium copper film; applying light to said first photosensitive film in all areas other than that to be used for conductive paths or resistive paths; removing said unexposed portions of said first photosensitive film; etching all areas of beryllium copper which are exposed to an etching means; depositing a film of nickel chromium alloy on said remaining substrate and beryllium copper; depositing a film of aluminum upon said nickel chromium alloy; depositing a film of copper upon said film of aluminum; coating said film of copper with a second film of photosensitive material; applying light to expose said areas to be used as conductive paths through the use of a negative photographic film mask; removing said unexposed portions of said second photosensitive film; etching said unprotected copper and aluminum and underetching said nickel chromium alloy supported by said beryllium copper with an etching means which does not etch nickel chromium alloy to leave said nickel chromium alloy deposited directly upon said substrate as paths in areas to be used as resistance means and to leave paths composed of nickel chromium alloy, aluminum, copper, and exposed photosensitive material to be used as conductive paths; and removing said remaining exposed photosensitive material to form a finished printed circuit means.

6. The method of producing a printed circuit which comprises the following steps: applying a first photosensitive film to fully cover a copper coated substrate; applying light to said first photosensitive film in all areas other than that to be used for conductive paths or resistive paths; removing said unexposed portions of said first photosensitive film; etching all areas of copper which are exposed to an etching means; depositing a film of resistance material on said remaining substrate and said copper; depositing a conductive layer upon said resistance material; coating said conductive layer with a second film of photosensitive material; applying light to expose said areas to be used as conductive paths; removing said unexposed portions of said second photosensitive film; etching said unprotected conductive layers and underetching said resistance material supported by said copper with an etching means which does not etch said resistance material to leave said resistance material deposited directly upon said substrate as paths in areas to be used as resistance means and to leave paths composed of resistance material, a conductive layer and exposed photosensitive material to be used as conductive paths; and removing said remaining exposed photosensitive material to form a finished printed circuit means.

7. The method of producing a printed circuit which comprises the following steps: applying a dissolvable mask to a substrate, said mask having open areas where conductive and resistive paths are to be on a finished product; depositing a film of resistive means on said dissolvable mask and on said substrate in said open areas of said mask; depositing a film of conductive means upon said film of resistive means; coating said film of conductive means with a film of photosensitive material; applying light to expose said areas to be used as conductive paths; removing said unexposed portions of said photosensitive material; etching said unprotected conductive means and underetching said resistive means supported by said dissolvable masks with an etching means which does not etch said resistive means to leave said resistive means deposited directly upon said substrate as paths in areas to be used as resistance paths and to leave paths composed of resistive means, conductive means, and exposed photosensitive material to be used as conductive paths; and removing said remaining exposed photosensitive material to form a finished printed circuit means.

8. A printed circuit comprising: substrate means for depositing conductor and resistor paths thereon; nickel chromium alloy paths deposited upon said substrate in all areas to be covered by said conductor paths and said resistor paths; aluminum paths deposited upon said nickel chromium alloy paths in areas to be used as conductor paths; and copper paths deposited upon said aluminum paths, said aluminum preventing interaction between said copper paths and said nickel chromium alloy paths, and said nickel chromium alloy paths not covered by said aluminum and copper being used as resistor paths.

9. In electronic apparatus: insulating substrate means; nickel chromium alloy resistive paths attached to said substrate means; and conductive paths attached to said substrate means, said conductive paths comprising nickel chromium alloy paths attached directly to said substrate means for good adhesion, aluminum paths attached to said nickel chromium alloy paths for good conductivity, and copper paths attached to said aluminum paths for ease in soldering connections to said conductive paths, said aluminum minimizing resistance change in said nickel chromium paths due to surface interactions.

References Cited by the Examiner

UNITED STATES PATENTS

| | | | |
|---|---|---|---|
| 2,447,836 | 8/1948 | Beeber et al. | 96—35 |
| 2,553,762 | 5/1951 | Gyuris | 96—35 |
| 2,559,389 | 7/1951 | Beeber et al. | 96—35 |
| 2,662,957 | 12/1953 | Eisler | 96—35 |
| 2,882,377 | 4/1959 | Rinehart | 338—307 |
| 2,912,312 | 11/1959 | Japel. | |
| 2,981,611 | 4/1961 | Ashworth. | |
| 3,061,911 | 11/1962 | Baker | 174—68.5 |

FOREIGN PATENTS

| | | |
|---|---|---|
| 116,016 | 8/1926 | Switzerland. |

OTHER REFERENCES

Biondi: Transistor Technology, Van Nostrand 1958, vol. III, p. 152.

NORMAN G. TORCHIN, *Primary Examiner.*

HAROLD N. BURSTEIN, *Examiner.*